United States Patent [19]
Gustafson

[11] Patent Number: 5,273,723
[45] Date of Patent: Dec. 28, 1993

[54] RESIST OXIDIZER WITH CATALYTIC REACTOR

[75] Inventor: Paul S. Gustafson, Germantown, Md.

[73] Assignee: Fusion Systems Corporation, Rockville, Md.

[21] Appl. No.: 883,015

[22] Filed: May 14, 1992

[51] Int. Cl.$^5$ ............... B01D 50/00; B01D 53/34
[52] U.S. Cl. ............................... 422/177; 422/171
[58] Field of Search .......................... 422/171, 177

[56] References Cited

U.S. PATENT DOCUMENTS

| | | | |
|---|---|---|---|
| 4,248,832 | 2/1981 | Aiken et al. | 422/177 |
| 4,407,785 | 10/1983 | Pfefferle | 422/171 |
| 5,071,485 | 12/1991 | Matthews et al. | 156/640 |

Primary Examiner—Robert J. Warden
Assistant Examiner—Krisanne M. Thornton
Attorney, Agent, or Firm—Pollock, Vande Sande & Priddy

[57] ABSTRACT

A catalytic reactor is used in the exhaust tract of a high pressure, high flow rate ozone asher to prevent resist deposit fouling of the exhaust tract.

7 Claims, 3 Drawing Sheets

RESIST OXIDIZER WITH CATALYTIC REACTOR

FIELD OF THE INVENTION

This invention relates to semiconductor chip manufacture.

BACKGROUND OF THE INVENTION

In the manufacture of integrated circuits, the technique of photolithography is frequently used. In the practice of this technique, a semiconductor wafer is coated with a photoresist, which is then exposed with ultraviolet radiation which is passed through a mask so that a desired pattern is imaged on the photoresist. This causes changes in the solubility of the exposed areas of the photoresist such that after development in a suitable solvent the desired pattern is fixed on the wafer, whereupon the photoresist may be hardbaked to enable it to withstand subsequent processing.

In such subsequent processing, integrated circuit components which correspond to the desired pattern are formed by processing including plasma etching or ion implantation.

After the integrated circuit components are formed, it is desired to strip the photoresist from the wafer, which at this point has already served its useful purpose. The relative ease or difficulty with which the photoresist may be stripped depends on the degree to which physical and chemical changes have been induced in the resist during the specific plasma etching or ion implantation processes and on the degree to which the resist has been cross-linked. Thus, it is generally known that a significant degree of hard baking and to an even greater extent, the processes of plasma etching and ion implantation induce physical and chemical changes in the photoresist, so that stripping is particularly difficult.

U.S. Pat. No. 4,885,047 to Ury et al which is assigned in common with the instant invention, teaches an apparatus for stripping resist from a semiconductor wafer wherein a planar member is established relative to a wafer to form a small gap therebetween, an oxidant such as ozone is passed at high speed along the wafer, and then the oxidant gas stream including oxidized resist is exhausted from the chamber. Such an apparatus is sometimes referred to as an asher.

U.S. Pat. No. 5,071,485 to Matthews et al which is also assigned in common with the instant invention teaches an improvement of the asher apparatus taught by Ury et al wherein the oxidant gas is supplied at the periphery of the wafer, flows radially inward with respect to the wafer, and is exhausted from above the center of the wafer. U.S. Pat. No. 5,071,485 to Matthews et al is incorporated herein by reference.

FIG. 1 is a schematic representation of the exhaust system of an actual asher of the type described in the above-identified patents. The ashing process is conducted in the processing chamber 1, wherein ozone is passed through a narrow gap as shown in the figure which overlies the resist. The ozone which oxidizes the resist in the ashing process is exhausted through a central orifice 2. The central orifice 2 is connected via a fitting 3 to a teflon exhaust conduit 4. The exhaust conduit 4 is connected via a second fitting 4a to an ozone destroyer 5. The ozone destroyer, 5 is necessary because all of the ozone is not used up in the processing chamber 1 and it is unsafe to release ozone. The ozone destroyer 5 comprises a vessel with an inlet and outlet which is filled with aluminum pellets so as to provide a large surface area of aluminum which is effective in reacting ozone into oxygen. The outlet 6 of the ozone destroyer 5 is connected to a second conduit. Most of the exhaust gas flows along the second conduit 7 to an ejector 8 and in turn to the plant facility exhaust (not shown) through final conduit 9. A small portion of the exhaust gas exiting from the ozone destroyer 5 through exit 6 is diverted to a branch conduit 7A and flows to a cooling heat exchanger 10 and then through a carbon dioxide content monitor II and finally to a second ejector 12. The carbon dioxide level in the exhaust indicates the resist oxidation rate and is used to monitor the ashing process.

This type of asher suffers from the problem that the resist, although oxidized to a sufficient degree to be broken free of the wafer, is not completely oxidized. Molecular and larger resist fragments are carried into the exhaust stream. These fragments tend to deposit and clog the system. In the particular system described above the fragments tend to deposit primarily at the fitting 4a leading into the ozone destroyer 5. Fouling also occurs at the exit port 6 of the ozone destroyer and at the heat exchanger 10.

The type of resist removal machine described above uses an oxidant gas at about atmospheric pressure. Other types of resist removal machines use low pressure gas and do not suffer so severely the problem of resist fouling in the exhaust tract. Of course the low pressure ashers have their own set of problems, an important one of which is that they can cause damage by bombarding the wafer with energetic species.

SUMMARY OF THE INVENTION

The present invention provides a catalytic reactor in the exhaust system of a resist oxidation system of the type in which resists fragments that are not completely oxidized are exhausted from the process chamber. The catalytic reactor includes catalyst means for promoting complete oxidation and thus decomposing the resist material, with the result that clogging of the exhaust tract is obviated. The catalyst means is a platinum group material. While catalytic reactors are known for treating volatile organic compounds (VOC's) for the purpose of eliminating pollutants, insofar as is known the present invention is the first use of such reactors for treating solid organic compounds in a resist removal system for eliminating fouling and blockages therein.

It is thus an object of this invention to reduce fouling resist deposits in the exhaust tract of a resist removal machine.

DETAILED DESCRIPTION OF THE PREFERRED EMBODIMENT

Figure 1:
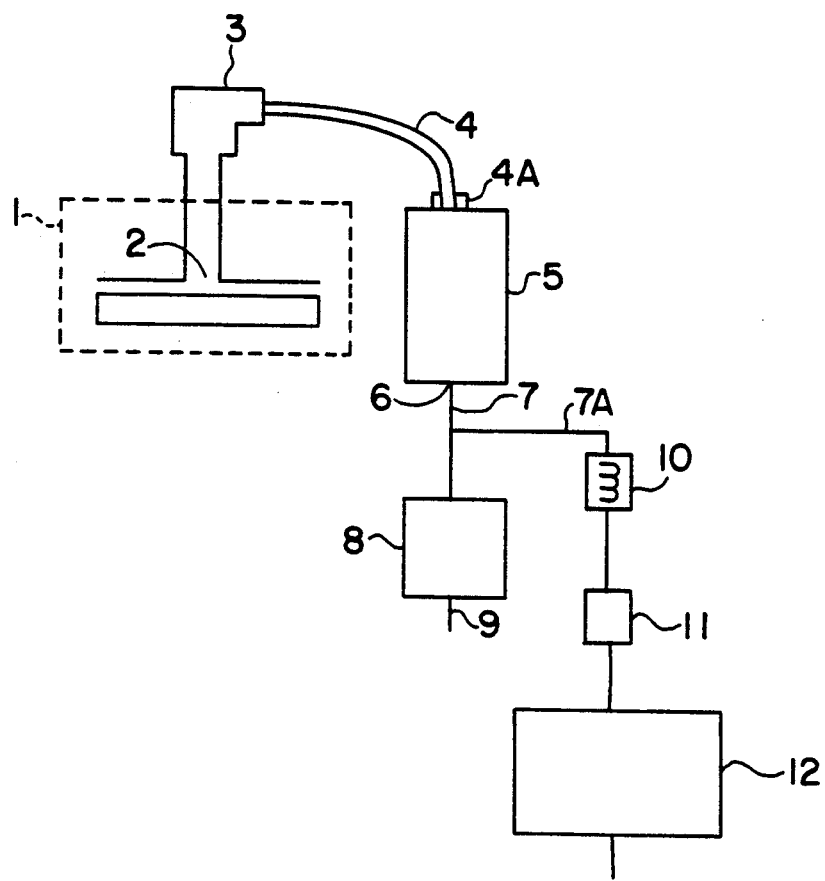
FIG. 1 is a schematic representation of a prior art system.
Figure 2:
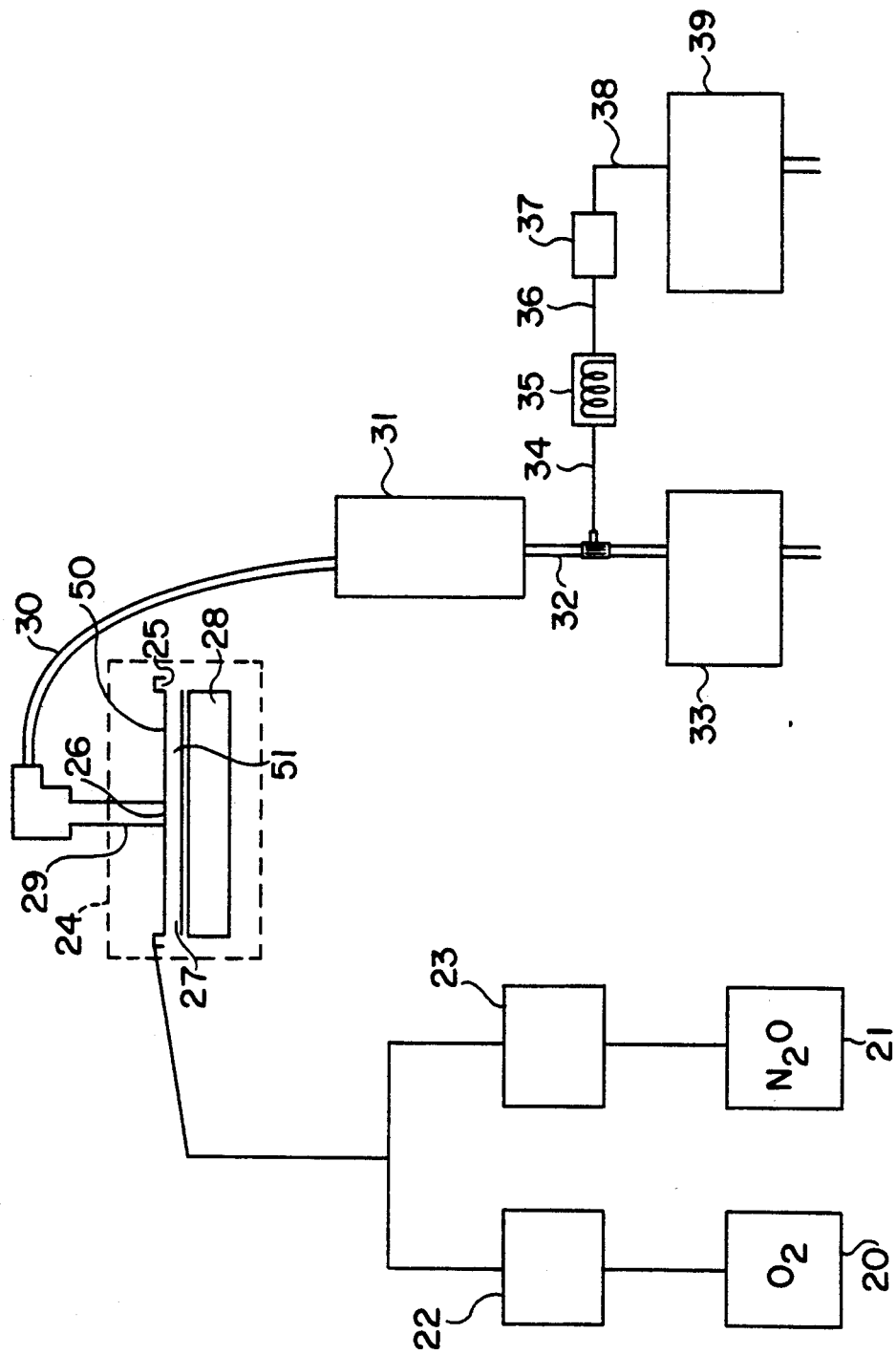
FIG. 2 is a schematic representation of a resist removal apparatus according to the invention.

Referring to FIG. 2, a schematic representation of the preferred embodiment of the invention is shown. An oxygen supply 20 and a nitrous oxide supply 21 are connected to separate RF excitation cells 22 and 23. Such excitation cells are well known in the art as ozone generators. After passing through the excitation cells 22, 23 the gas flows to the process chamber 24 where it is fed through an annular feed 25 located around the wafer. Above the wafer is a quartz plate 50 which is separated from the wafer by a narrow gap 51. The wafer 27 rests on a heated platform 28. An exhaust opening 26 which is located at the center of the quartz plate, leads into the exhaust tract.

The exhaust tract has multiple parts as will now be described. A vertically oriented stainless steel tube 29 is connected to the exhaust opening. The vertical tube 29 is connected through a right angle bend to a disposable teflon exhaust hose 30.

In accordance with the invention, a catalytic reactor is provided in the exhaust tract. In the preferred embodiment, as shown in FIG. 2, the teflon tube 30 feeds directly into the reactor 31. The catalytic reactor 31 serves to complete oxidation of the resist fragments in the exhaust stream and also to bring about substantially complete conversion of the residual ozone in the exhaust stream to oxygen. The catalyst which is used to bring about a catalytic reaction to decompose the solid organic material is a platinum group material. As used herein, the term "platinum group material" refers to platinum, palladium or nickel, and alloys thereof. The catalyst material is heated so that the reaction takes place above about 200° C. While higher temperatures may also be used, the reaction may be carried out between about 200° C. and about 500° C.

Figure 3:
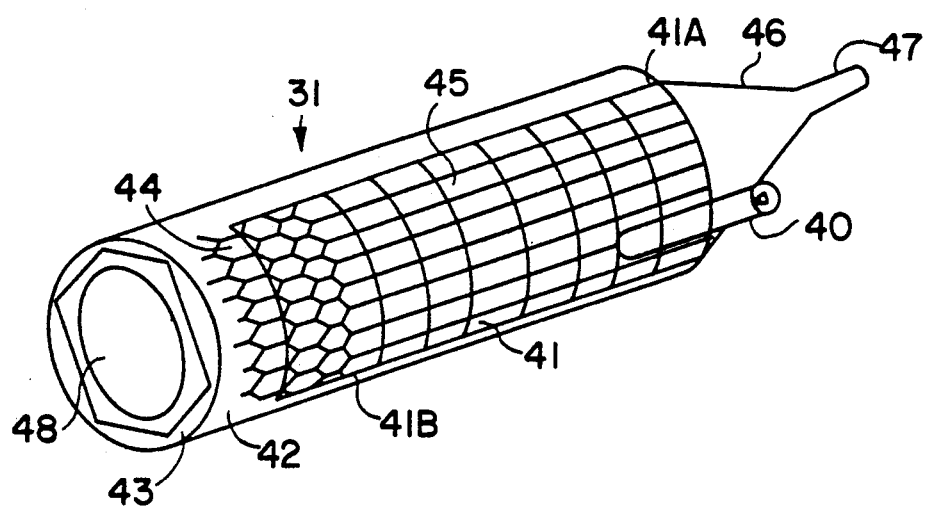
FIG. 3 is a pictorial representation of the catalytic reactor used in the preferred embodiment of the invention.

Referring to FIG. 3, a schematic representation of a preferred embodiment of the catalytic reactor 31 is shown. The reactor 31 is generally cylindrical and uses a bi-directional coaxial flow design. Thus, flow is introduced from the teflon exhaust hose into a radial inlet 40. A cylindrical baffle 41 within the outer cylindrical wall 42 establishes an axial flow from the inlet towards the forward end 43 of the reactor. The back end of the baffle 41A abuts and is sealed around its outside to the outer wall 42 so that flow in the backward direction is prevented. The forward end 41B of the baffle 41, however, stops short of the end of the outer wall 42 so that the exhaust gas flows beyond the forward end 41B of the baffle 41 and is turned inward, and thus, flows axially inside of the baffle 41 in the backward direction. Occupying the space inside the baffle 41 is a catalyst element 44. The element 44 comprises a high open area, high surface area hexagonal honeycomb support. The support may be made of cordierite ceramic. On the support is plated the catalyst material, as described above. One example of a catalyst which may be used is a platinum rhodium alloy. Such a catalyst element 44 is made by Engelhard Corp and is designated P5. A funnel shaped flow transition section 46 is connected to the back end of the baffle 41. A nipple 47 tops the funnel 46. After passing through the catalyst element 44 the exhaust gas flows through the funnel 46 and in turn through the nipple 47. An ohmic heating element 45 is wrapped around the outside of the baffle 41. The heating element 45 is preferably operated at a power sufficient to maintain the exhaust gas flowing through the catalyst element at least about 200° C. The length, cross sectional area, and hexagonal cell density of the catalyst element can be determined by trial and error experimentation such that the resist fragments are substantially completely oxidized, and the ozone is substantially completely converted to oxygen. In the embodiment shown the length of the element is eight inches, the cross sectional area is 0.75 square inches and the honeycomb density is 200 cells per square inch, such arrangement providing for substantially complete oxidation of the exhaust resist fragments, and substantially complete conversion of ozone to oxygen. Due to the high open area, pressure drop is not a problem. The forward end 43 of the outer wall 42 is closed by a threaded plug 48. The plug closure permits the catalyst element 44 to be replaced at the end of its life.

Returning to the description of the other parts of the system with reference again to FIG. 2, a second conduit 32 leads from the catalytic reactor 31 to a main ejector 33. The main ejector 33 ejects into the exhaust system of the facility in which the apparatus is installed. Branching off the main ejector is a third conduit 34. The third conduit 34 flows into a deionized water cooled heat exchanger 35. A fourth conduit 36 continues the flow path of the third conduit 34 out of the heat exchanger and leads to a carbon dioxide monitor 37. The carbon dioxide level is related to the resist removal reaction and is used as an endpoint detector for the process. The heat exchanger 35 is necessary to cool the exhaust gas to a temperature suitable for use by the carbon dioxide monitor 37.

The operating parameters of an actual system are as follows. Oxygen is supplied at nearly atmospheric pressure at about 25 SLM (Standard Liters per Minute). The oxygen RF exciter 20 is powered at 2100 watts, while the nitrous oxide exciter 21 is powered at 230 watts. The heated platform 28 may typically be operated at about 300° C. It is to be understood that the above are the base settings and that the parameters may be varied to suit particular applications. The relatively high flow rate and pressure of the oxidant, differentiates this system from other dry oxidant resist removal systems, where exhaust blockage due to resist material is not a serious problem.

It should be understood that the invention has been illustrated in connection with a preferred embodiment, and that variations which fall within the spirit and scope of the invention will occur to those skilled in the art. Thus, it should be understood that the scope of the invention is defined and limited only by the claims which are appended hereto and equivalents.

I claim:

1. An apparatus for removing resist from a wafer wherein blockages due to resist material in the exhaust tract are obviated, comprising,
   a processing chamber,
   means for supporting a wafer having resist to be removed disposed in said processing chamber,
   means for supplying an oxidizing gas to said processing chamber for removing said resist,
   an exhaust tract in communication with said processing chamber, and
   a catalytic reactor means disposed in said exhaust tract which includes a platinum group catalyst for decomposing incompletely oxidized resist material.

2. The apparatus of claim 1 wherein said platinum group catalyst is platinum or palladium in elemental or alloy form.

3. The apparatus of claim 1 wherein said catalytic reactor means includes heating means for maintaining the temperature of the platinum group catalyst above about 200° C.

4. The apparatus of claim 3 wherein said heating means maintains the temperature of the platinum group catalyst between about 200° C. and 500° C.

5. The apparatus of claim 1 wherein said means for supplying an oxidizing gas comprises an oxidant gas supply and an RF oxidant gas exciter.

6. An apparatus for removing resist from a wafer wherein blockages due to resist material in the exhaust tract are obviated, comprising, a processing chamber, means for supporting a wafer having resist to be removed disposed in said processing chamber, means for supplying an oxidizing gas to said processing chamber for oxidizing and removing said resist, an exhaust tract in communication with said processing chamber and for receiving an exhaust stream thereof, and a catalytic reactor means disposed in said exhaust tract for decomposing the oxidized resist material and for substantially completely converting residual ozone in said exhaust stream to oxygen, said catalytic reactor means including a platinum group catalyst.

7. The apparatus of claim 6 wherein said platinum group catalyst is platinum or palladium in elemental or alloy form.

* * * * *